US008810973B2

(12) United States Patent
Gill

(10) Patent No.: US 8,810,973 B2
(45) Date of Patent: Aug. 19, 2014

(54) CURRENT PERPENDICULAR TO PLANE MAGNETORESISTIVE SENSOR EMPLOYING HALF METAL ALLOYS FOR IMPROVED SENSOR PERFORMANCE

(75) Inventor: Hardayal Singh Gill, Palo Alto, CA (US)

(73) Assignee: HGST Netherlands B.V., Amsterdam (NL)

( * ) Notice: Subject to any disclaimer, the term of this patent is extended or adjusted under 35 U.S.C. 154(b) by 1609 days.

(21) Appl. No.: 12/119,961

(22) Filed: May 13, 2008

(65) Prior Publication Data

US 2009/0284873 A1 Nov. 19, 2009

(51) Int. Cl.
*G11B 5/39* (2006.01)

(52) U.S. Cl.
USPC ............... 360/324.1; 360/324.11; 360/324.2

(58) Field of Classification Search
USPC ............................ 360/324.1, 324.11, 324.2
See application file for complete search history.

(56) References Cited

U.S. PATENT DOCUMENTS

| 7,262,064 | B2 | 8/2007 | Ohba et al. ........................ 438/3 |
| 2003/0137785 | A1* | 7/2003 | Saito ......................... 360/324.11 |
| 2006/0044705 | A1* | 3/2006 | Hasegawa et al. ......... 360/324.11 |
| 2006/0067012 | A1* | 3/2006 | Li et al. ..................... 360/324.11 |
| 2006/0227467 | A1 | 10/2006 | Ide et al. ................... 360/324.11 |
| 2007/0048485 | A1 | 3/2007 | Jogo et al. ..................... 428/64.1 |
| 2007/0109693 | A1 | 5/2007 | Carey et al. ............... 360/324.12 |
| 2007/0183098 | A1 | 8/2007 | Tsuchiya et al. ........... 360/324.1 |
| 2007/0242396 | A1 | 10/2007 | Shimazawa et al. ...... 360/324.12 |
| 2007/0267596 | A1 | 11/2007 | Husmann et al. ............... 252/67 |
| 2007/0297103 | A1 | 12/2007 | Zhang et al. .............. 360/324.12 |
| 2007/0297104 | A1 | 12/2007 | Mizuno et al. ............ 360/324.12 |
| 2008/0019060 | A1 | 1/2008 | Mizuno et al. ............ 360/324.12 |
| 2008/0198514 | A1* | 8/2008 | Jogo et al. .................. 360/324.1 |
| 2009/0091864 | A1* | 4/2009 | Carey et al. .............. 360/324.11 |
| 2009/0168269 | A1* | 7/2009 | Carey et al. .............. 360/324.11 |

FOREIGN PATENT DOCUMENTS

JP 2004221526 8/2004 ............. C22C 19/07

OTHER PUBLICATIONS

Daibou et al., "Tunnel Magnetoresistance Effect in CoFeB/MgO/Co2FeSi and Co2MnSi) Tunnel Junctions" IEEE Transactions on Magnetics, Oct. 2006, vol. 42, Issue 10, pp. 2655-2657.

* cited by examiner

*Primary Examiner* — Wayne Young
*Assistant Examiner* — Carlos E Garcia
(74) *Attorney, Agent, or Firm* — Zilka-Kotab, PC

(57) ABSTRACT

A magnetoresistive sensor having employing a Mn containing Huesler alloy for improved magnetoresistive performance in a structure that minimizes corrosion and Mn migration. The sensor can be constructed with a pinned layer structure that includes a lamination of layers of $Co_2MnX$ and CoFe, where X is Al, Ge or Si. The $Co_2MnX$ can be sandwiched between the layers of CoFe to prevent Mn migration into the spacer/barrier layer. The free layer can also be constructed as a lamination of $Co_2MnX$ and CoFe layers, and may also be constructed so that the $Co_2MnX$ layer is sandwiched between CoFe layers to prevent Mn migration.

13 Claims, 8 Drawing Sheets

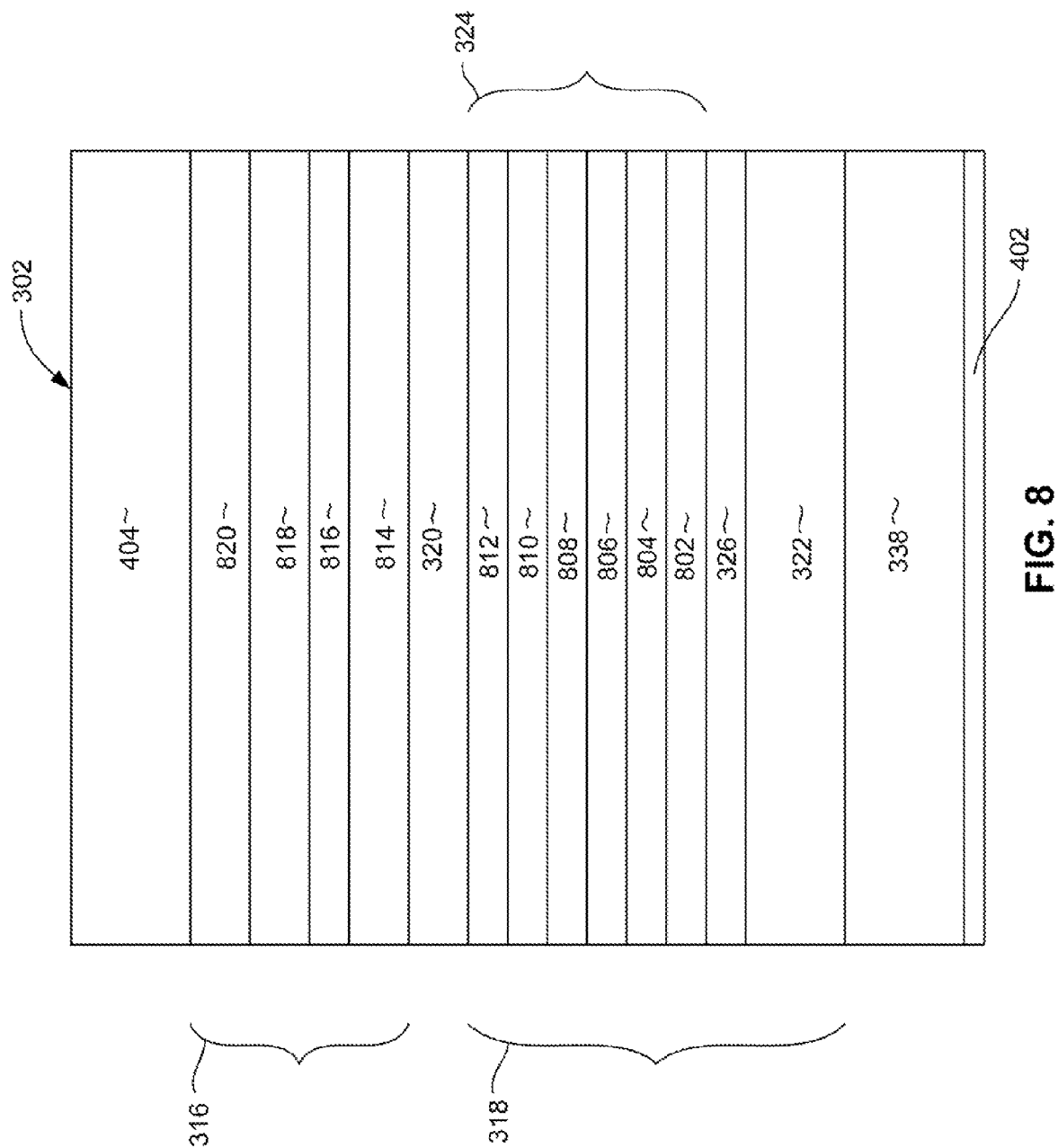

CURRENT PERPENDICULAR TO PLANE MAGNETORESISTIVE SENSOR EMPLOYING HALF METAL ALLOYS FOR IMPROVED SENSOR PERFORMANCE

FIELD OF THE INVENTION

The present invention relates to magnetoresistive sensors and more particularly to a sensor employing Mn containing Heusler alloys for improved magnetoresistive performance performance while also exhibiting high corrosion resistance and low Mn diffusion.

BACKGROUND OF THE INVENTION

The heart of a computer is an assembly that is referred to as a magnetic disk drive. The magnetic disk drive includes a rotating magnetic disk, write and read heads that are suspended by a suspension arm adjacent to a surface of the rotating magnetic disk and an actuator that swings the suspension arm to place the read and write heads over selected circular tracks on the rotating disk. The read and write heads are directly located on a slider that has an air bearing surface (ABS). The suspension arm biases the slider into contact with the surface of the disk when the disk is not rotating but, when the disk rotates, air is swirled by the rotating disk. When the slider rides on the air bearing, the write and read heads are employed for writing magnetic impressions to and reading magnetic impressions from the rotating disk. The read and write heads are connected to processing circuitry that operates according to a computer program to implement the writing and reading functions.

The write head includes a coil layer embedded in first, second and third insulation layers (insulation stack), the insulation stack being sandwiched between first and second pole piece layers. A gap is formed between the first and second pole piece layers by a gap layer at an air bearing surface (ABS) of the write head and the pole piece layers are connected at a back gap. Current conducted to the coil layer induces a magnetic flux in the pole pieces which causes a magnetic field to fringe out at a write gap at the ABS for the purpose of writing the aforementioned magnetic impressions in tracks on the moving media, such as in circular tracks on the aforementioned rotating disk.

In recent read head designs a spin valve sensor, also referred to as a giant magnetoresistive (GMR) sensor, has been employed for sensing magnetic fields from the rotating magnetic disk. The sensor includes a nonmagnetic conductive layer, hereinafter referred to as a spacer layer, sandwiched between first and second ferromagnetic layers, hereinafter referred to as a pinned layer and a free layer. First and second leads are connected to the spin valve sensor for conducting a sense current therethrough. The magnetization of the pinned layer is pinned perpendicular to the air bearing surface (ABS) and the magnetic moment of the free layer is located parallel to the ABS, but free to rotate in response to external magnetic fields. The magnetization of the pinned layer is typically pinned by exchange coupling with an antiferromagnetic layer.

The thickness of the spacer layer is chosen to be less than the mean free path of conduction electrons through the sensor. With this arrangement, a portion of the conduction electrons is scattered by the interfaces of the spacer layer with each of the pinned and free layers. When the magnetizations of the pinned and free layers are parallel with respect to one another, scattering is minimal and when the magnetizations of the pinned and free layer are antiparallel, scattering is maximized. Changes in scattering alter the resistance of the spin valve sensor in proportion to $\cos \theta$, where $\theta$ is the angle between the magnetizations of the pinned and free layers. In a read mode the resistance of the spin valve sensor changes proportionally to the magnitudes of the magnetic fields from the rotating disk. When a sense current is conducted through the spin valve sensor, resistance changes cause potential changes that are detected and processed as playback signals.

SUMMARY OF THE INVENTION

The present invention provides a magnetoresistive sensor that uses Huesler alloys for improved magnetoresistive performance while also minimizing corrosion and Mn migration. The sensor includes a free layer structure and a pinned layer structure with a non-magnetic barrier or spacer layer sandwiched between the free and pinned layer. The pinned layer includes a lamination of layers of $Co_2MnX$ and CoFe (where X is Al, Ge or Si).

By forming the pinned layer with a lamination of $Co_2MnX$ and CoFe, the amount of Mn exposed at the air bearing surface is greatly reduced, thereby minimizing corrosion, while also allowing the advantages of the $Co_2MnX$ alloy for sensor performance improvement.

The lamination of layer can be configured so that the layer of $Co_2MnX$ is sandwiched between layers of CoFe, which advantageously prevents the migration of Mn into adjacent layers such as the spacer/barrier layer.

The free layer can also be constructed as a lamination of $Co_2MnX$ and CoFe layers, and may be configured with a layer of $Co_2MnX$ sandwiched between CoFe layers to prevent Mn migration. The free layer may also be constructed as an antiparallel coupled free layer structure or as a simple free layer structure.

These and other features and advantages of the invention will be apparent upon reading of the following detailed description of preferred embodiments taken in conjunction with the Figures in which like reference numerals indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

FIGS. 4-8 are ABS views of a sensor stack of a magnetoresistive sensor according to various embodiments of the invention.

DETAILED DESCRIPTION OF THE PREFERRED EMBODIMENTS

The following description is of the best embodiments presently contemplated for carrying out this invention. This description is made for the purpose of illustrating the general principles of this invention and is not meant to limit the inventive concepts claimed herein.

Figure 1:
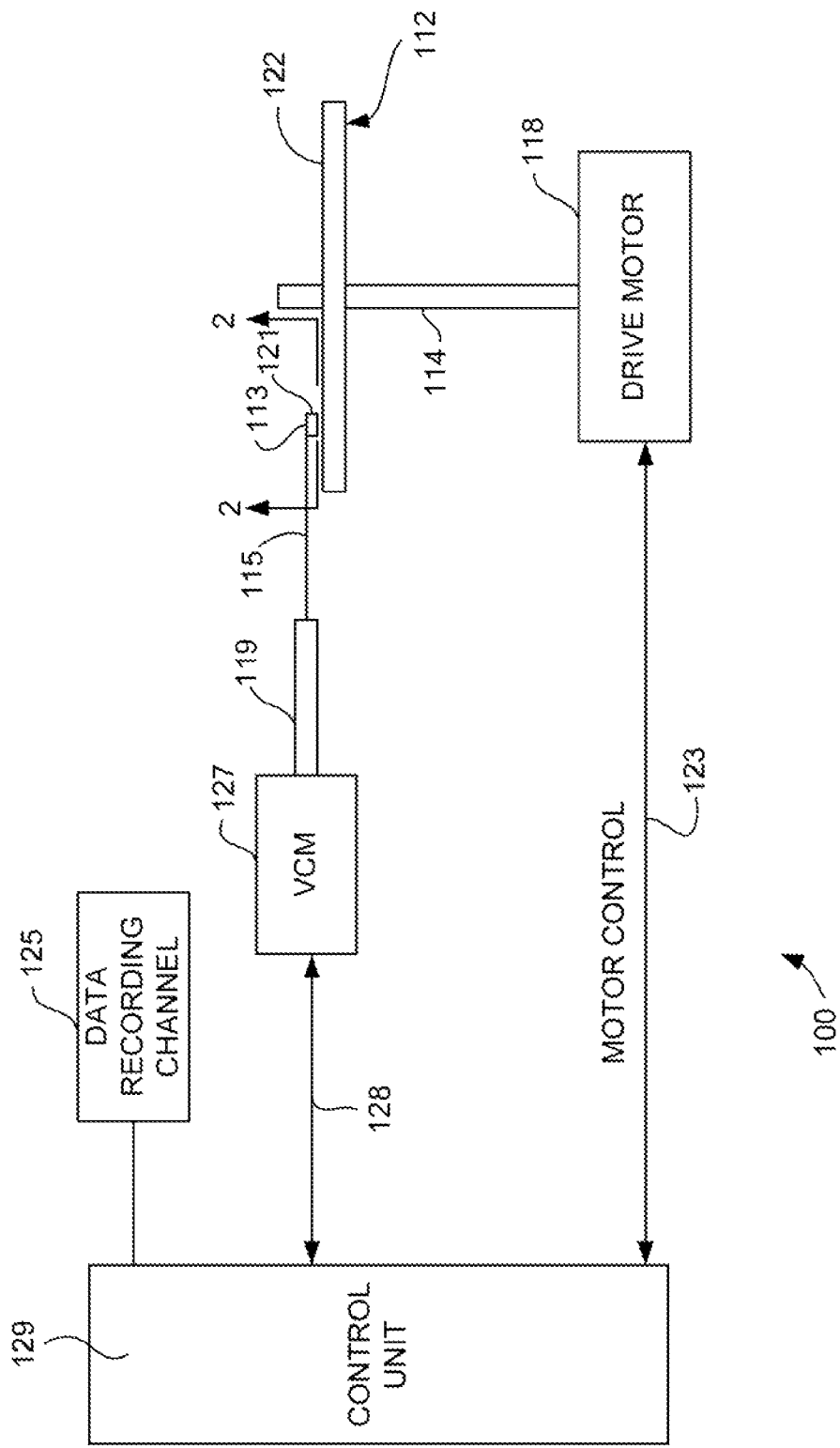
FIG. 1 is a schematic illustration of a disk drive system in which the invention might be embodied.

Referring now to FIG. 1, there is shown a disk drive 100 embodying this invention. As shown in FIG. 1, at least one rotatable magnetic disk 112 is supported on a spindle 114 and rotated by a disk drive motor 118. The magnetic recording on each disk is in the form of annular patterns of concentric data tracks (not shown) on the magnetic disk 112.

At least one slider 113 is positioned near the magnetic disk 112, each slider 113 supporting one or more magnetic head assemblies 121. As the magnetic disk rotates, slider 113 moves radially in and out over the disk surface 122 so that the magnetic head assembly 121 may access different tracks of the magnetic disk where desired data are written. Each slider 113 is attached to an actuator arm 119 by way of a suspension 115. The suspension 115 provides a slight spring force which biases slider 113 against the disk surface 122. Each actuator arm 119 is attached to an actuator means 127. The actuator means 127 as shown in FIG. 1 may be a voice coil motor (VCM). The VCM comprises a coil movable within a fixed magnetic field, the direction and speed of the coil movements being controlled by the motor current signals supplied by controller 129.

During operation of the disk storage system, the rotation of the magnetic disk 112 generates an air bearing between the slider 113 and the disk surface 122 which exerts an upward force or lift on the slider. The air bearing thus counter-balances the slight spring force of suspension 115 and supports slider 113 off and slightly above the disk surface by a small, substantially constant spacing during normal operation.

The various components of the disk storage system are controlled in operation by control signals generated by control unit 129, such as access control signals and internal clock signals. Typically, the control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Write and read signals are communicated to and from write and read heads 121 by way of recording channel 125.

Figure 2:
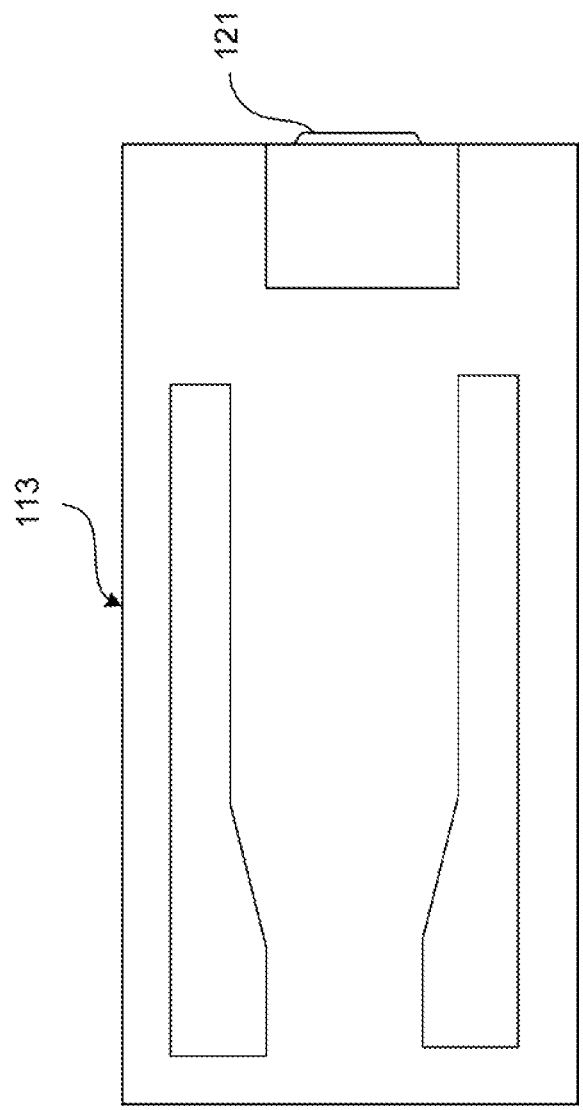
FIG. 2 is an ABS view of a slider illustrating the location of a magnetic head thereon.

With reference to FIG. 2, the orientation of the magnetic head 121 in a slider 113 can be seen in more detail. FIG. 2 is an ABS view of the slider 113, and as can be seen the magnetic head including an inductive write head and a read sensor, is located at a trailing edge of the slider. The above description of a typical magnetic disk storage system, and the accompanying illustration of FIG. 1 are for representation purposes only. It should be apparent that disk storage systems may contain a large number of disks and actuators, and each actuator may support a number of sliders.

Figure 3:
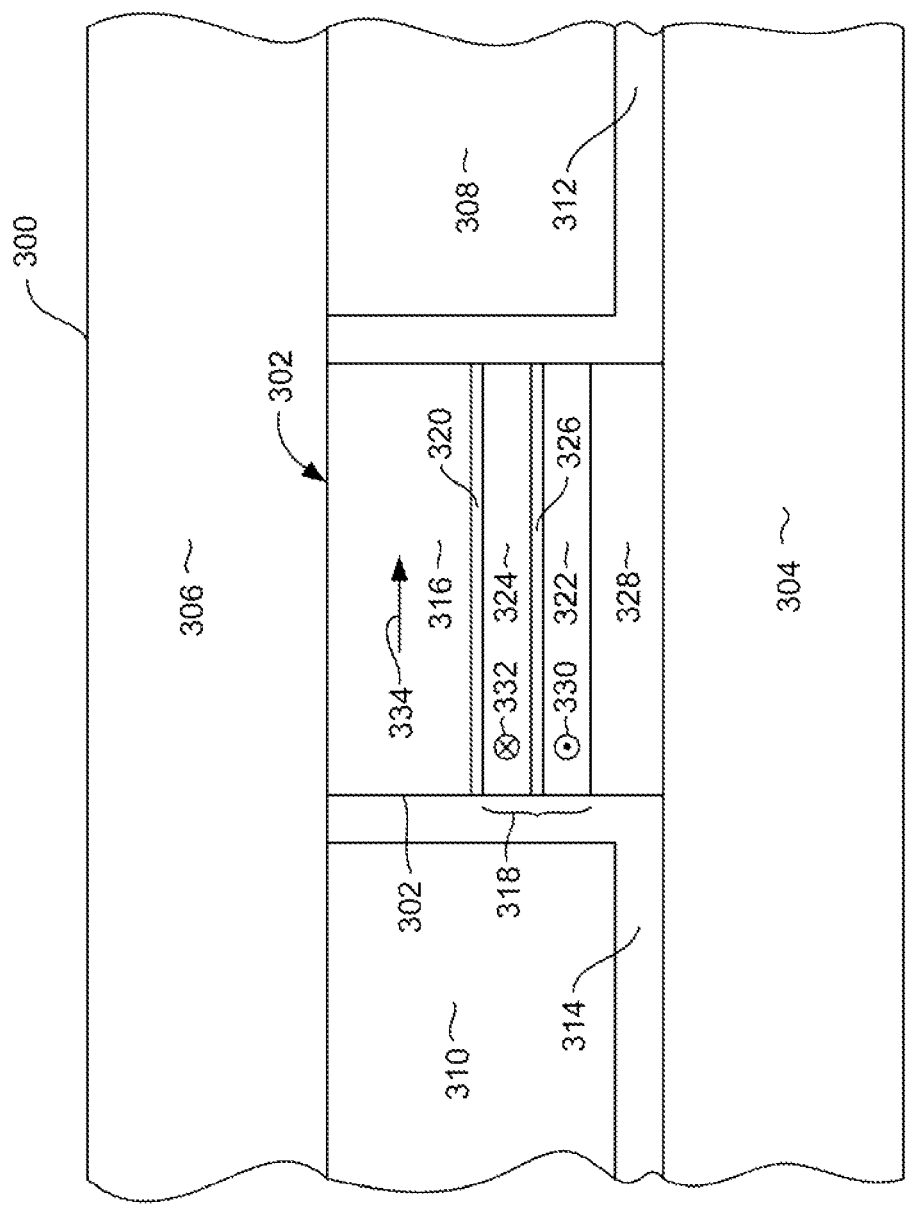
FIG. 3 is an enlarged ABS view of a magnetoresistive sensor of a magnetic head for use in disk drive system.

With reference now to FIG. 3, a magnetic read head 302 is shown as viewed from the air bearing surface (ABS). The read head 300 includes a magnetoresistive sensor stack 302 that is sandwiched between first and second electrically conductive lead layers 304, 306. The lead layers 304, 306 can be constructed of a magnetic material such as NiFe or CoFe so that they can function as magnetic shields as well as electrically conductive leads.

The sensor stack 302 includes a magnetic free layer structure 316 and a magnetic pinned layer structure 318. A non-magnetic layer 320 is sandwiched between the free layer 316 and pinned layer structure 318. It should be pointed out at this point that the invention can be embodied in a current perpendicular to plane giant magnetoresistive sensor (CPP GMR) or in a tunnel junction magnetoresistive sensor (TMR). If the read head 300 is a CPP GMR, then the non-magnetic layer 320 is an electrically conductive, non-magnetic spacer layer constructed of a material such as Cu or an oxide of Cu. On the other hand, if the read head 300 is a TMR sensor, then the non-magnetic layer 320 will be a thin, non-magnetic, electrically insulating barrier layer, constructed of a material such as MgO or AlO.

The pinned layer structure 318 includes a magnetically pinned layer 322 (AP2) and a reference layer 324 (AP2). The layers 322 and 324 are antiferromagnetically coupled across a non-magnetic antiparallel coupling layer 326. The pinned layer 322 can be exchange coupled with a layer of antiferromagnetic material (AFM) 328 such as IrMn or PtMn which strongly pins the magnetization of the pinned layer 322 in a first direction perpendicular to the ABS as indicated by arrowhead symbol 330. The antiparallel coupling between the layers 322, 324, then strongly pins the magnetization of the reference layer 324 as indicated by arrow tail symbol 332.

First and second hard bias layers 308, 310 can be provided at either side of the sensor stack 302. The hard bias layers 308, 310 can be constructed of a hard magnetic material such as CoPt or CoPtCr, and provide a magnetic bias field that biases a magnetization of a magnetic free layer 316 in a direction parallel with the ABS as indicated by arrow symbol 334. The hard bias layers 308, 310 are separated from the sensor stack 302 and at least one of the lead/shield layers 304 by non-magnetic, electrically insulating layers 312, 314, which can be, for example, alumina. Various configurations of the sensor stack 302, according to various possible embodiments of the invention, will be described in greater detail with reference to FIGS. 4-8.

The use of Heusler alloys in a pinned and free layer structures of a CPP magnetoresistive sensor (either tunnel or GMR) can provide significant performance improvements such as higher dR/R. However, the presence of Mn in these alloys poses corrosion and reliability problems. In addition, the materials used in spacer or barrier layers strongly attract the Mn used in such Heusler alloys, causing the Mn to diffuse into the spacer or barrier layer. This diffusion of Mn into the spacer or barrier layer has a disastrous affect on sensor performance. As a result, these materials have not been successfully used in commercial heads, and the potential performance benefits have not been realized. The present invention includes pinned layer and free layer structures that can allow the performance advantageous provided by these Heusler alloys to be realized, while avoiding the above mentioned corrosion and diffusion problems associated with such materials. Various embodiments for achieving this are described below with reference to FIGS. 4-8, which show ABS views of a sensor stack according to various possible embodiments of the invention.

Figure 4:
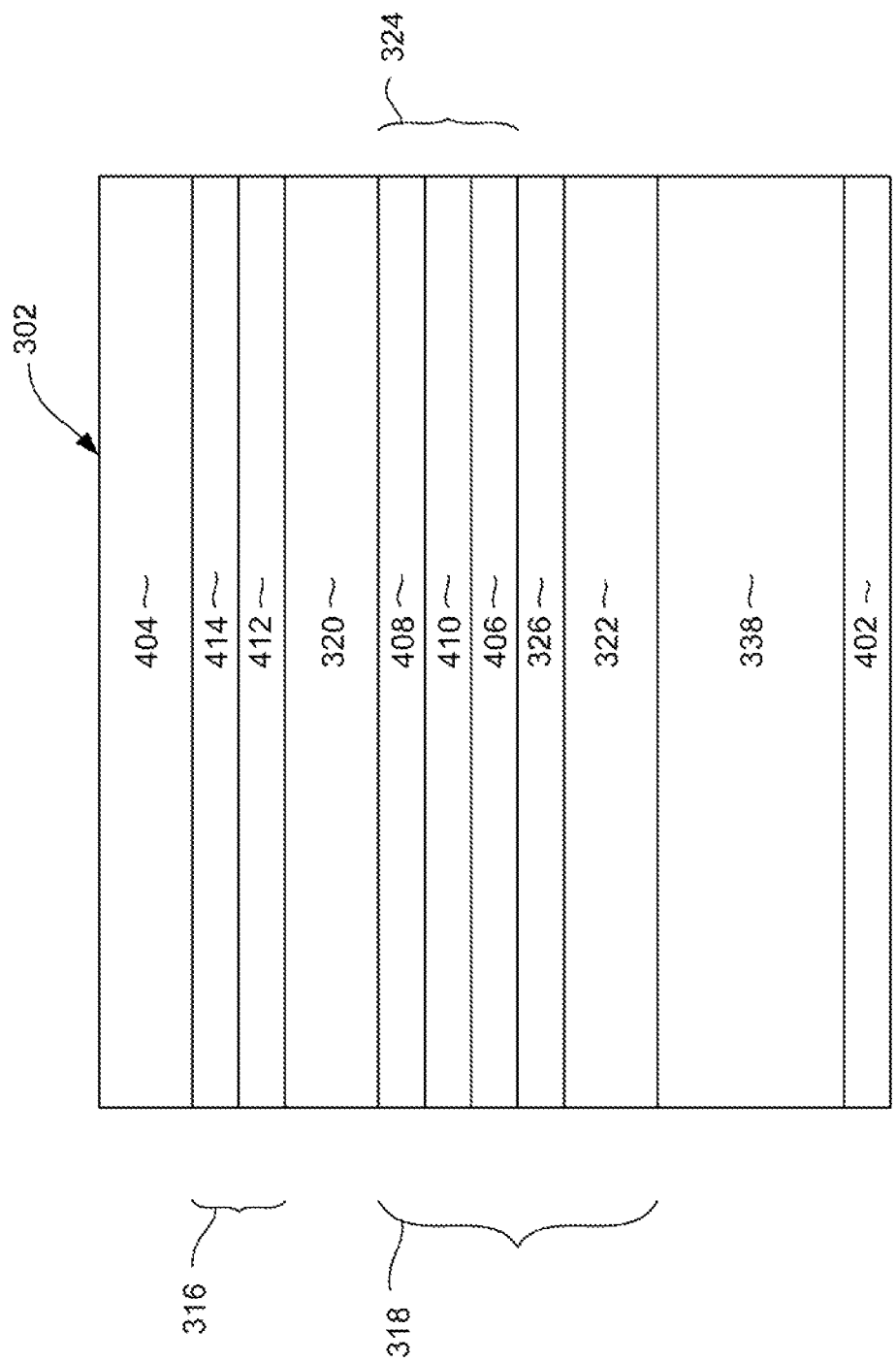

With reference now to FIG. 4, a sensor stack 302 according to an embodiment of the invention is described. The sensor stack 302 can include a seed layer 402 formed at the bottom of the sensor stack for initiating a desired grain structure in the above layers, and a capping layer 404, such as Ta, at the top of the sensor stack 302 to protect the layers of the sensor stack during manufacture.

The AP coupled pinned layer structure includes a pinned layer 322 that, as mentioned above, is exchange coupled with the AFM layer 338. The pinned layer 322 is preferably constructed of CoFe which exhibits good exchange coupling with IrMn.

The reference layer 324 is a multi-layer structure that provides the magnetoresistive enhancement benefits of a Heusler alloy without the corrosion and diffusion problems that have previously been associated with such alloys. The reference layer 324 includes a nano-layer of CoFe 406 adjacent to the Ru AP coupling layer 326, and a nano-layer of $Co_2MnX$ 408 adjacent to the spacer/barrier layer 320, where X can be Si, Ge or Al. A nano-layer of CoFeX 410 (where X is Si, Ge or Al) is sandwiched between the layers 406 and 408.

With continued reference to FIG. 4, the free layer structure includes a nano-layer of $Co_2MnX$ 412 adjacent to the spacer/barrier layer 320 and a nano-layer of $Co_2FeX$ 414 away from the spacer/barrier layer 320. Again the element X can be a material selected from the group consisting of Si, Ge and Al.

By using nano-layers of $Co_2FeX$ along with other layers, the amount of Mn that can be exposed at the air bearing surface (ABS) is greatly reduced. This allows the advantageous use of a Heusler alloy in the pinned and free layer structures 318, 316, while greatly reducing the chance of corrosion associated with the use of such materials.

Figure 5:
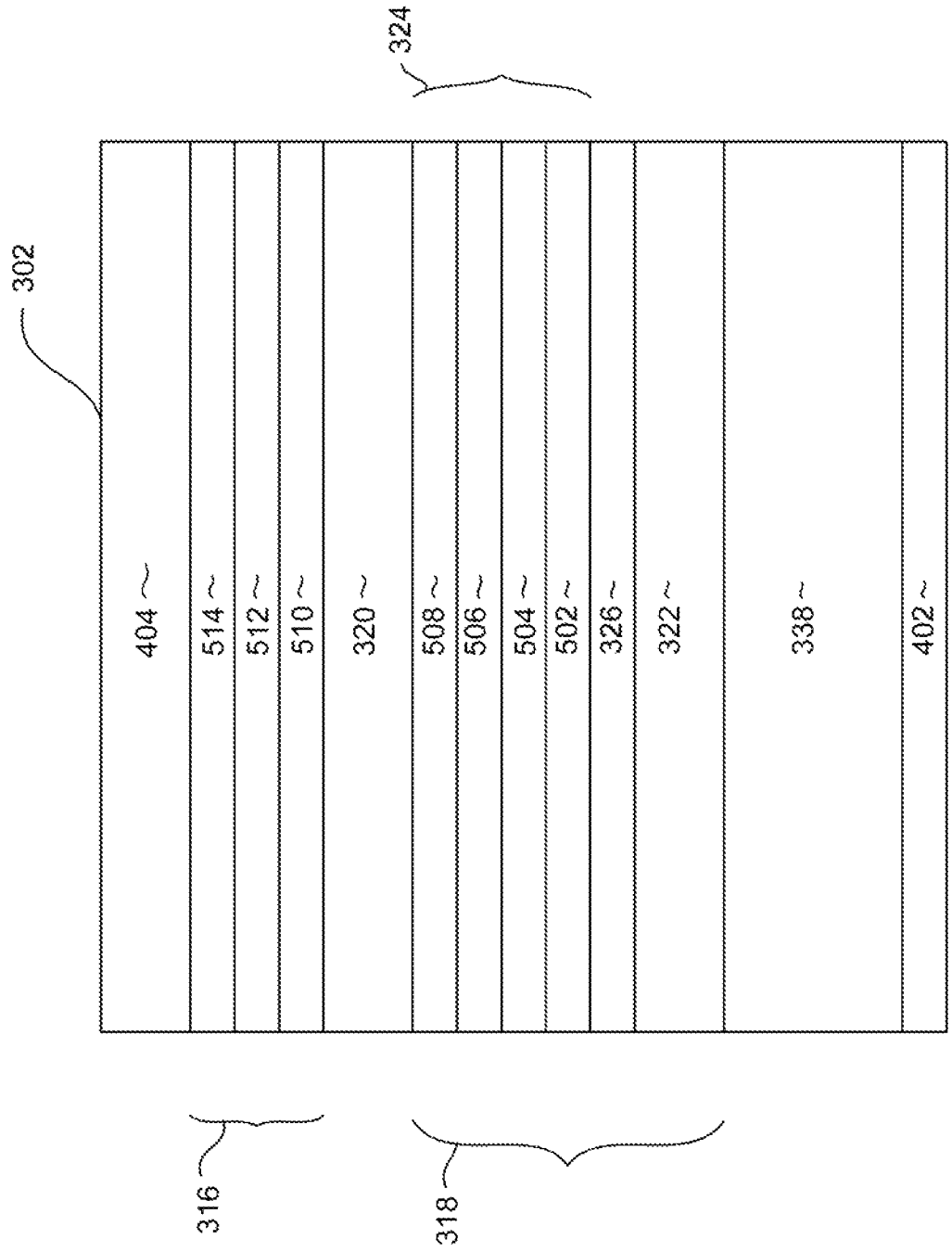

With reference now to FIG. 5, in another embodiment of the invention, the pinned layer structure includes a pinned layer 322 constructed of CoFe, and a Ru AP coupling layer 326 formed over the pinned layer 322. The reference layer 324 is a multi-layer structure that includes a CoFe nano-layer adjacent to the Ru AP coupling layer. A tri-layer structure 503 is formed above the CoFe nano-layer 502. The tri-layer structure 503 includes a layer of $Co_2MnX$ 506 sandwiched between first and second layers of $Co_2FeX$ 504, 508. In other words, the reference layer includes consecutive layers of CoFe 502, $Co_2FeX$ 504, $Co_2MnX$ 506 and $Co_2FeX$ 508. The element X can be Si, Al or Ge.

Similarly, the free layer 316 includes a layer of $Co_2MnX$ 512 sandwiched between first and second layers of $Co_2FeX$ 510, 514, where X can be Si, Al or Ge. The free layer 316, therefore includes consecutive layers of $Co_2FeX$ 510, $Co_2MnX$ 512, and $Co_2FeX$ 514, with the first layer of $Co_2FeX$ 510 being located adjacent to the spacer/barrier layer 320. As can be seen, then in each of the free and pinned layers 316, 318 has a Mn containing layer of Heusler alloy sandwiched between layers that don't contain Mn.

As with the previously described embodiment, the multi-layer structure reduces the amount of Mn exposed at the air bearing surface which reduces the chance of corrosion. The total thickness of the free layer 316 can be about 40 Angstroms, and the thickness of the $Co_2MnX$ layer 512 can be about 5-15 Angstroms. Therefore, as can be seen, the free layer 316 has a small amount of Mn containing material to be exposed at the ABS.

However, this embodiment has the added advantage that the Mn containing layers 504, 512 are removed from the spacer/barrier layer 320. As mentioned above, the material making up the layer 320 (whether it is a spacer or barrier layer) tend to strongly attract and absorb Mn. Therefore, if a layer containing Mn is placed adjacent to the spacer/barrier layer 320, the Mn can diffuse into the spacer/barrier layer 320, which can seriously degrade magnetic performance. In the presently described embodiment, Mn diffusion is prevented by the layers 508, 510. In addition, diffusion of Mn into the AP coupling layer 326 is prevented by the layer 502. Similarly, diffusion of Mn into the capping layer 404 is prevented by the layer 514.

Figure 6:
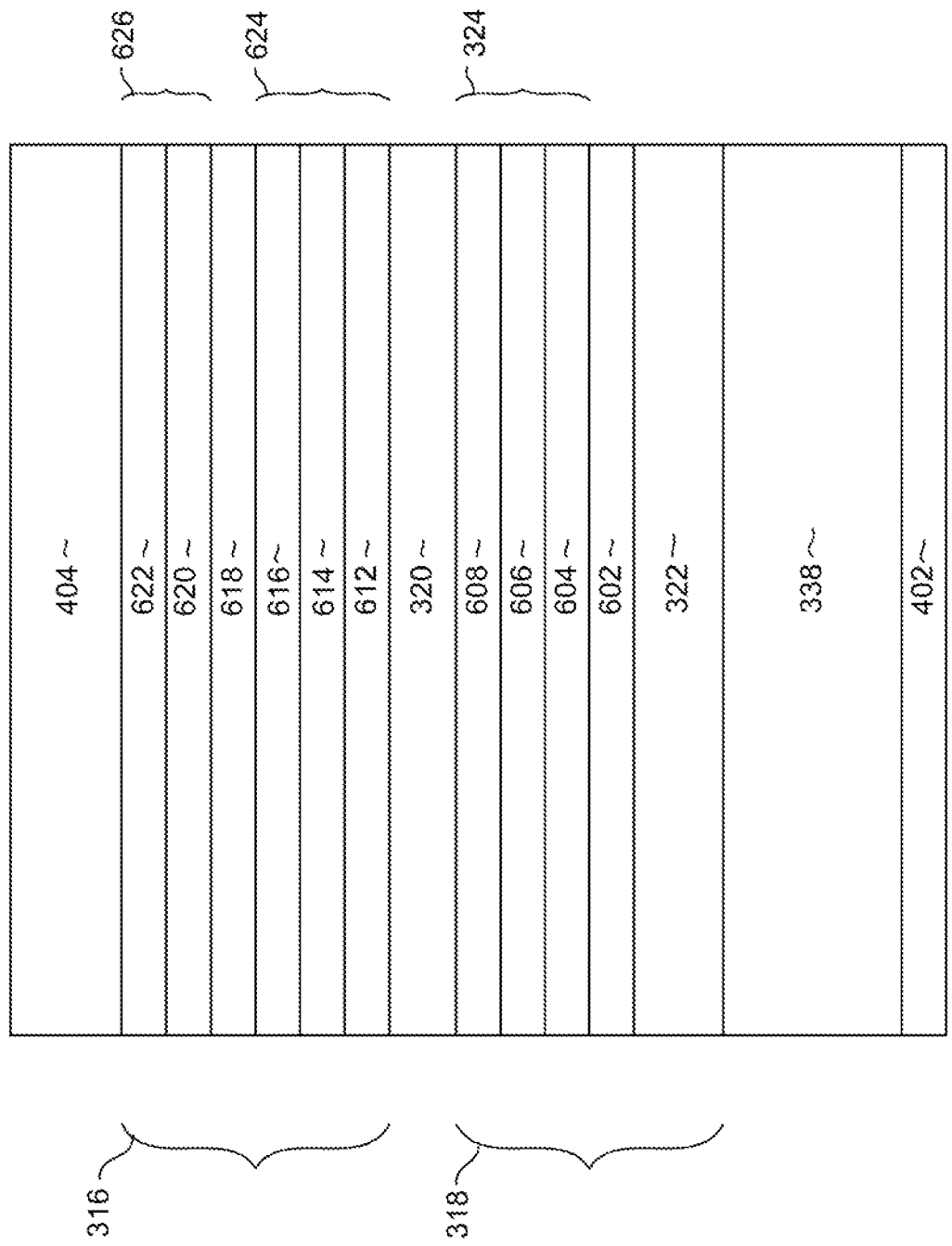

With reference now to FIG. 6, another embodiment is described which further prevents corrosion. This embodiment is similar to that described above in FIG. 5, except that in the Mn containing layers, 5-10 atomic percent of the Mn has been replaced by Cr. In addition, this embodiment uses an AP coupled free layer for improved free layer sensitivity. However, it should be pointed out that the AP coupled free layer could be used with the other described embodiments as well. In addition, the embodiment described herein with reference to FIG. 6, could also be constructed with a simple (not AP coupled) free layer.

With this in mind, the sensor stack 302 of FIG. 6 can include a pinned layer 318 having a first and second magnetic layer structures 322, 324, which are antiparallel coupled across a Ru AP coupling layer 602. The First magnetic layer 322 can be CoFe, which strongly exchange couples with the AFM layer 338. The second magnetic layer 324 can include a layer of $Co_2[Mn_{1-x}Cr_x]Si$, $Co_2[Mn_{1-x}Cr_x]Al$ or $Co_2[Mn_{1-x}Cr_x]Ge$ 606 (where x is 0.05 to 0.1) sandwiched between first and second layers of CoFe 604, 608. Each of the layers 604, 606, 608 can have a thickness of 5-15 Angstroms.

With continued reference to FIG. 6, the free layer structure 316 includes a first magnetic layer structure 624 and a second magnetic layer structure 626, which are antiparallel coupled across a second non-magnetic antiparallel coupling layer 618 that can be constructed of Ru. The first magnetic layer structure 624 can include a layer of $Co_2[Mn_{1-x}Cr_x]Si$, $Co_2[Mn_{1-x}Cr_x]Al$ or $Co_2[Mn_{1-x}Cr_x]Ge$ 614 sandwiched between layers of CoFe 612, 616. As with the above described layer, in the layer 614 X can be 0.05 to 0.1. Each of the layers 612, 614, 616 can have a thickness of 5-30 Angstroms. The second magnetic layer 626 can be constructed of a layer of CoFe 620 adjacent to the AP coupling layer 618 and a layer of NiFe 622 formed over the layer 618.

Figure 7:
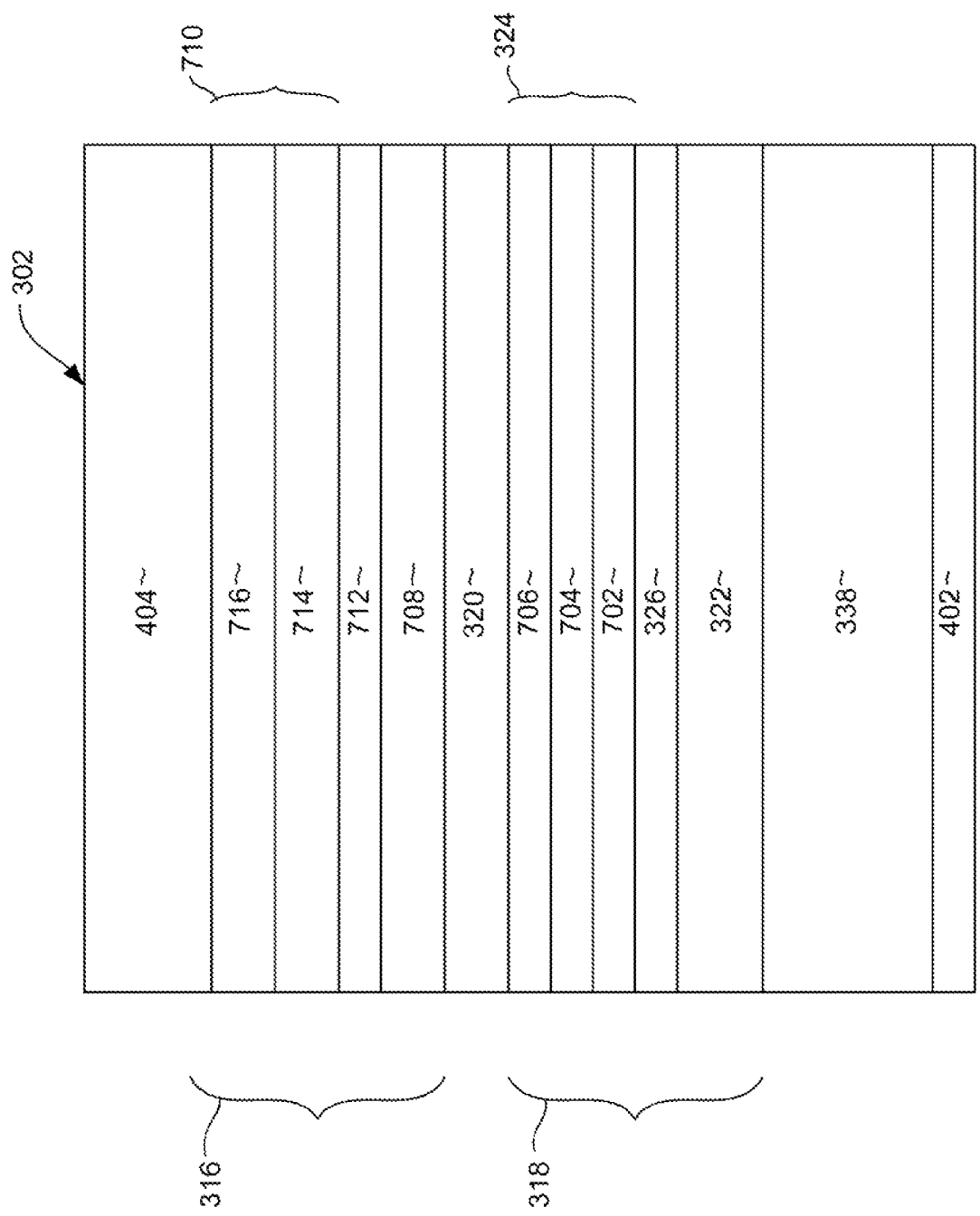

With reference now to FIG. 7, another embodiment of the invention is described. This embodiment, can be considered to a preferred embodiment. The sensor stack 302 has a Heusler alloy only in the pinned layer structure. Therefore, the sensor stack 302 has a pinned layer structure 318 that has first and second magnetic layer structures 322, 324 that are AP coupled across an AP coupling layer 326. The second magnetic layer structure 324, the layer closest to the spacer layer 320 includes a layer of $Co_2[Mn_{1-x}Cr_x]Si$, $Co_2[Mn_{1-x}Cr_x]Al$ or $Co_2[Mn_{1-x}Cr_x]Ge$ 704 (where x is 0.05 to 0.1) sandwiched between first and second layer of CoFe 702, 706.

The free layer 316 can be an AP coupled structure including a first magnetic layer comprising CoFe 708 adjacent to the spacer/barrier layer 320, and a second magnetic layer structure 710 that is AP coupled with the first layer 708 across an AP coupling layer 712, such as Ru. The second magnetic layer 710 of the free layer structure 316 can include a layer of CoFe 714 adjacent to the AP coupling layer and a second layer comprising NiFe 716.

Heusler alloys, such as the $Co_2[Mn_{1-x}Cr_x]Si$, $Co_2[Mn_{1-x}Cr_x]Al$ or $Co_2[Mn_{1-x}Cr_x]Ge$ tend to have high magnetic coercivities (they are hard to make soft) and have a positive magnetostriction, which can be problematic in a free layer structure. The high coercivity makes the free layer less sensitive to magnetic fields. The positive magnetostriction (when combined with compressive stresses that are inevitably present in magnetic heads) produce a magnetic anisotropy that is perpendicular to the air bearing surface. This causes the free layer to be unstable and difficult to effectively bias. In the above described embodiments, these effects are mitigated to a large extend by the laminated structures that reduce the amount of Huesler alloy that is present in the free layer. In the embodiment described with reference to FIG. 7, however, the Heusler alloy is completely removed from the free layer. This allows the advantages of the Heusler alloy to be realized in the pinned layer, without the negative effects of magnetostriction and coercivity described above affecting the free layer performance.

With reference to FIG. 8 still another embodiment of the invention is described. This embodiment includes a pinned layer structure 318 having a first magnetic layer 322 constructed of 322 and a second magnetic layer structure 324 that is AP coupled with the first layer 322. The second layer 324 includes alternating layers of CoFe 802, 806, 810 and Co$_2$FeX 804, 808, 812, where X is can be Si or Al.

Similarly, the free layer structure 316 is constructed of alternating layers of NiFe 816, 820 and Co$_2$FeX 814, 818 where X is Al or Si. Preferably in both the free layer structure 316 and pinned layer 318, a layer of Co$_2$FeX 814, 812 is adjacent to the barrier/spacer layer 320. Note that in this embodiment the Mn has been completely removed from the Huelser alloy. Therefore, this embodiment completely eliminates the corrosion, and diffusion problems associated with the use of Mn.

While various embodiments have been described above, it should be understood that they have been presented by way of example only and not limitation. Other embodiments falling within the scope of the invention may also become apparent to those skilled in the art. Thus, the breadth and scope of the invention should not be limited by any of the above-described exemplary embodiments, but should be defined only in accordance with the following claims and their equivalents.

What is claimed is:

1. A magnetoresistive sensor, comprising:
   a magnetic free layer structure;
   a magnetic pinned layer structure comprising a lamination of layers of Co$_2$FeX and a layer Co$_2$MnX, where X is a material selected from the group consisting of Al, Ge and Si, wherein the layer of Co$_2$MnX is sandwiched between the layers of Co$_2$FeX; and
   a non-magnetic layer sandwiched between the free layer structure and the pinned layer structure wherein one of the layers of Co$_2$FeX acts as a diffusion barrier to prevent the Mn from diffusion from the layer of Co$_2$MnX into the non-magnetic layer.

2. A magnetoresistive sensor, comprising:
   a magnetic free layer structure;
   a magnetic pinned layer structure comprising a lamination of layers of Co$_2$FeX and Co$_2$MnX, where X is a material selected from the group consisting of Al, Ge and Si; and
   a non-magnetic layer sandwiched between the free layer structure and the pinned layer structure;
   wherein the pinned layer is constructed such that a layer of Co$_2$FeX is adjacent to the non-magnetic layer so as to prevent migration of Mn from the Co$_2$MnX into the non-magnetic layer.

3. A magnetoresistive sensor as in claim 1 wherein the pinned layer comprises a layer of Co$_2$MnX sandwiched between first and second layers of Co$_2$FeX.

4. A magnetoresistive sensor as in claim 1 wherein the pinned layer structure further comprises a first magnetic layer comprising CoFe, a second magnetic layer structure and an antiparallel coupling layer sandwiched between the first magnetic layer and the second magnetic layer structure, the second magnetic layer structure being located between the antiparallel coupling layer and the non-magnetic layer, and wherein the second magnetic layer structure comprises the lamination of layers of Co$_2$FeX and Co$_2$MnX, where X is a material selected from the group consisting of Al, Ge and Si.

5. A magnetoresistive sensor as in claim 1 wherein the free layer comprises a lamination of layers of Co$_2$MnX and Co$_2$FeX.

6. A magnetoresistive sensor as in claim 1 wherein the free layer comprises a layer of Co$_2$MnX sandwiched between first and second layers of Co$_2$FeX.

7. A magnetoresistive sensor as in claim 1 wherein the free layer includes first and second magnetic layer structures and an antiparallel coupling layer sandwiched between the first and second magnetic layer structures, each of the first and second magnetic layer structures comprising a layer of Co$_2$MnX sandwiched between layers of Co$_2$FeX.

8. A magnetoresistive sensor as in claim 1 wherein the free layer comprises first and second magnetic layer structures and an antiparallel coupling layer sandwiched between the first and second magnetic layer structures, the first magnetic layer structure being adjacent to the non-magnetic layer and comprising a layer of Co$_2$MnX sandwiched between layers of CoFe, the second magnetic layer structure comprising a layer of CoFe and a layer of NiFe.

9. A magnetoresistive sensor as in claim 1 wherein the free layer comprises first and second magnetic layer structures and an antiparallel coupling layer sandwiched between the first and second magnetic layer structures, the first magnetic layer structure being adjacent to the non-magnetic layer and comprising CoFe, the second magnetic layer structure comprising a layer of CoFe and a layer of NiFe.

10. A magnetoresistive sensor as in claim 1 wherein the free layer comprises a layer of Co$_2$MnX adjacent to the non-magnetic layer and a layer of Co$_2$FeX adjacent to the layer of Co$_2$MnX.

11. A magnetoresistive sensor as in claim 1 wherein the layer of Co$_2$MnX has a thickness of 5 to 10 Angstroms.

12. A magnetoresistive sensor as in claim 10 wherein the layers of Co$_2$MnX each have a thickness of 5 to 10 Angstroms.

13. A magnetoresistive sensor as in claim 1 wherein the free layer comprises a layer of Co$_2$MnX and a layer of Co$_2$FeX, with the layer of Co$_2$MnX being adjacent to the non-magnetic layer, and wherein X is a material selected from the group consisting of Al, Ge and Si.

* * * * *